United States Patent
Kurmaev et al.

(10) Patent No.: US 10,848,185 B2
(45) Date of Patent: Nov. 24, 2020

(54) CODING AND DECODING OF POLAR CODES EXTENDED TO LENGTHS WHICH ARE NOT POWERS OF TWO

(71) Applicant: Huawei Technologies Co., Ltd., Shenzhen (CN)

(72) Inventors: Oleg Feat'evich Kurmaev, Moscow (RU); Petr Vladimirovich Trifonov, Saint Petersburg (RU); Alexey Mikhailovich Razinkin, Moscow (RU); Aleksei Eduardovich Maevskii, Moscow (RU)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 2 days.

(21) Appl. No.: 16/272,173

(22) Filed: Feb. 11, 2019

(65) Prior Publication Data

US 2019/0173496 A1  Jun. 6, 2019

Related U.S. Application Data

(63) Continuation of application No. PCT/RU2016/000539, filed on Aug. 12, 2016.

(51) Int. Cl.
*H03M 13/29* (2006.01)
*H03M 13/03* (2006.01)
*H03M 13/13* (2006.01)
*H03M 13/15* (2006.01)
*H03M 13/00* (2006.01)

(52) U.S. Cl.
CPC ..... *H03M 13/2927* (2013.01); *H03M 13/033* (2013.01); *H03M 13/13* (2013.01); *H03M 13/152* (2013.01); *H03M 13/2909* (2013.01); *H03M 13/618* (2013.01)

(58) Field of Classification Search
CPC .......... H03M 13/2927; H03M 13/033; H03M 13/13; H03M 13/152; H03M 13/2909; H03M 13/618; H03M 13/6502
See application file for complete search history.

(56) References Cited

U.S. PATENT DOCUMENTS 9,239,778 B2   1/2016  Lee et al.
2014/0208183 A1  7/2014  Mahdavifar et al.
(Continued)

FOREIGN PATENT DOCUMENTS

CN   105141322 A   12/2015
WO   WO-2017176302 A1 * 10/2017 ............ H03M 13/13

OTHER PUBLICATIONS

P. Trifonov and V. Miloslavskaya, "Polar Subcodes," in IEEE Journal on Selected Areas in Communications, vol. 34, No. 2, pp. 254-266, Feb. 2016. (Year: 2016).*
(Continued)

*Primary Examiner* — Cynthia Britt
(74) *Attorney, Agent, or Firm* — Slater Matsil, LLP

(57) ABSTRACT

An encoding apparatus includes a processor a non-transitory computer-readable storage medium storing a program for encoding data into a codeword. The program includes instructions to encode the data x using a code that is a product of a matrix generated using the Kronecker product of the Q with itself and factors generated according to frozen bit indices of the code and a constraint matrix generated according to a precoding matrix.

20 Claims, 13 Drawing Sheets

Encode Data x into Codeword c

Encoding data x of dimension k using a $C(n,k,d)$ code, wherein the code $C(n,k,d)$ has a length $n$ and a minimum distance $d$, wherein $n = 2^{m_1} + \cdots + 2^{m_s}$, wherein $m_h$, $h = 1,...,s$, is an integer number, on the basis of the equation $c = uA$, wherein $u_i = x_{j_i}$, $0 \le j_i < k-1$, if $i \notin F$, wherein $F$ is a set of $n-k$ frozen bit indices of the code $C(n,k,d)$, and $u_i = \sum_{s=0}^{i-1} V_{\phi_i,s} u_s$, if $i \in F$, wherein $V$ is a constraint matrix given by a solution of the equation $WV^T = 0$, wherein $\phi_i$ is an index of a row of the matrix $V$, which has a last non-zero element in column $i$, wherein $W$ is a precoding matrix, and wherein $A$ is defined as follows: $A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix}$, wherein $A_{m_h} = \begin{pmatrix} 1 & 0 \\ 1 & 1 \end{pmatrix}^{\otimes m_h}$, and wherein $Q^{\otimes m}$ denotes the $m$-times Kronecker product of a matrix $Q$ with itself

(56) References Cited

U.S. PATENT DOCUMENTS

| | | | |
|---|---|---|---|
| 2015/0295593 A1 | 10/2015 | Trifonov et al. | |
| 2015/0333769 A1 | 11/2015 | Jeong et al. | |
| 2015/0333775 A1 | 11/2015 | Korb et al. | |
| 2018/0026663 A1* | 1/2018 | Wu | H03M 13/6362 714/776 |
| 2020/0021307 A1* | 1/2020 | Ionita | H04L 27/364 |

OTHER PUBLICATIONS

Alltop, W.O., "A Method for Extending Binary Linear Codes," IEEE Transactions on Information Theory, vol. IT-30, No. 6, Nov. 1984, 2 pages.

Arikan, E., "Channel Polarization: A Method for Constructing Capacity-Achieving Codes for Symmetric Binary-Input Memoryless Channels," IEEE Transactions on Information Theory, vol. 55, No. 7, Jul. 2009, 23 pages.

Bakshi, M. et al., "Concatenated Polar Codes," IEEE International Symposium on Information Theory, arXiv:1001.2545v1 [cs.IT], Jan. 14, 2010, 5 pages.

Miloslavskaya, V. et al., "Shortened Polar Codes," IEEE Transactions on Information Theory, vol. 61, No. 9, Sep. 2015, 14 pages.

Miloslavskaya, V. et al., "Sequential Decoding of Polar Codes," IEEE Communications Letters, vol. 19, No. 7, Jul. 2014, 4 pages.

Niu, K. et al., "Polar Codes: Primary Concepts and Practical Decoding Algorithms," IEEE Communications Magazine, Jul. 2014, 12 pages.

Shin, D.M. et al., "Design of Length-Compatible Polar Codes Based on the Reduction of Polarizing Matrices," IEEE Transactions on Communications, vol. 61, No. 7, Jul. 2013, 7 pages.

Sloane, N.J.A., et al., "New Binary Codes," IEEE Transactions on Information Theory, vol. IT-18, No. 4, Jul. 1972, 8 pages.

Tal, I. et al., "List Decoding of Polar Codes," IEEE Transactions on Information Theory, vol. 61, No. 5, May 2015, 14 pages.

Trifonov, P. et al., "Polar Subcodes," IEEE Journal on Selected Areas in Communications, (vol. 34, Issue: 2, Feb. 2016 (Oct. 15, 2018)), Nov. 5, 2015, 27 pages.

Wang, R. et al., "A Novel Puncturing Scheme for Polar Codes," IEEE Communications Letters, vol. 18, No. 12, Dec. 2014, 4 pages.

* cited by examiner

Nested Generator Matrix [0,0]    $G^{(0,0)} = \begin{pmatrix} 1 & 1 & 1 & 1 & 1 & 1 & 1 & 1 & 1 & 1 & 1 & 1 & 1 & 1 & 1 & 1 \end{pmatrix}$ Nested Generator Matrix [0,1]    $G^{(0,1)} = \begin{pmatrix} 1 & 1 & 1 & 1 & 1 & 1 & 1 & 1 & 0 & 0 & 0 & 0 & 0 & 0 & 0 & 0 \\ 1 & 0 & 1 & 0 & 1 & 0 & 1 & 0 & 1 & 0 & 1 & 0 & 1 & 0 & 1 & 0 \\ 1 & 1 & 0 & 0 & 1 & 1 & 0 & 0 & 1 & 1 & 0 & 0 & 1 & 1 & 0 & 0 \\ 1 & 0 & 0 & 0 & 1 & 0 & 0 & 0 & 1 & 0 & 0 & 0 & 1 & 0 & 0 & 0 \end{pmatrix}$ Nested Generator Matrix [0,2]    $G^{(0,2)} = \begin{pmatrix} 1 & 1 & 0 & 1 & 0 & 1 & 0 & 0 & 0 & 1 & 1 & 0 & 0 & 0 & 0 & 0 \\ 1 & 0 & 1 & 0 & 0 & 1 & 1 & 0 & 0 & 0 & 0 & 1 & 1 & 0 & 0 & 0 \end{pmatrix}$ Nested Generator Matrix [0,3]    $G^{(0,3)} = \begin{pmatrix} 1 & 1 & 1 & 1 & 0 & 0 & 0 & 0 & 0 & 0 & 0 & 0 & 0 & 0 & 0 & 0 \\ 1 & 0 & 1 & 0 & 1 & 0 & 0 & 0 & 0 & 0 & 0 & 0 & 0 & 0 & 0 & 0 \\ 1 & 0 & 0 & 1 & 0 & 0 & 1 & 0 & 0 & 1 & 0 & 0 & 0 & 0 & 0 & 0 \\ 1 & 0 & 0 & 0 & 1 & 0 & 0 & 0 & 1 & 0 & 0 & 0 & 1 & 0 & 0 & 0 \end{pmatrix}$

Fig. 1a

Nested Generator Matrix [1,0]
$$G'^{(1,0)} = \begin{pmatrix} 1 & 1 & 1 & 1 & 1 & 1 & 1 & 1 \end{pmatrix}$$

Nested Generator Matrix [1,1]
$$G'^{(1,1)} = \begin{pmatrix} 1 & 1 & 1 & 1 & 0 & 0 & 0 & 0 \\ 1 & 0 & 1 & 0 & 1 & 0 & 1 & 0 \\ 1 & 0 & 0 & 1 & 1 & 0 & 0 & 1 \end{pmatrix}$$

Nested Generator Matrix [1,2]
$$G'^{(1,2)} = \begin{pmatrix} 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \end{pmatrix}$$

Fig. 1b $$W(0,0) = \begin{pmatrix} 0 & 0 & 0 & 0 & 0 & 0 & 0 & 1 \end{pmatrix}$$

Precoding Matrix [0,0]

$$W(0,1) = \begin{pmatrix} 0 & 0 & 0 & 0 & 1 & 0 & 0 & 0 \\ 0 & 0 & 0 & 0 & 0 & 0 & 1 & 0 \\ 0 & 0 & 0 & 0 & 0 & 0 & 0 & 1 \\ 0 & 0 & 0 & 0 & 0 & 1 & 1 & 0 \end{pmatrix}$$

Precoding Matrix [0,1]

$$W(0,2) = \begin{pmatrix} 0 & 0 & 0 & 1 & 0 & 0 & 1 & 1 & 0 & 1 & 0 & 0 & 0 \\ 0 & 0 & 1 & 0 & 1 & 1 & 0 & 0 & 1 & 0 & 0 & 0 & 0 \end{pmatrix}$$

Precoding Matrix [0,2]

$$W(0,3) = \begin{pmatrix} 0 & 0 & 0 & 0 & 0 & 1 & 0 & 0 & 0 & 0 & 0 \\ 0 & 0 & 0 & 0 & 1 & 0 & 0 & 0 & 0 & 1 & 0 \\ 0 & 0 & 0 & 1 & 0 & 0 & 0 & 0 & 1 & 0 & 0 \\ 0 & 0 & 0 & 0 & 0 & 0 & 1 & 1 & 0 & 0 & 0 \end{pmatrix}$$

Precoding Matrix [0,3]

Fig. 1c

Precoding
Matrix [1,0] $W^{(1,0)} = \begin{pmatrix} 0 & 0 & 0 & 0 & 0 & 0 & 0 & 1 \end{pmatrix}$ Precoding
Matrix [1,1] $W^{(1,1)} = \begin{pmatrix} 0 & 0 & 0 & 1 & 0 & 0 & 0 & 0 \\ 0 & 0 & 0 & 0 & 0 & 0 & 1 & 0 \\ 0 & 0 & 0 & 0 & 0 & 1 & 1 & 0 \end{pmatrix}$ Precoding
Matrix [1,2] $W^{(1,2)} = \begin{pmatrix} 0 & 1 & 0 & 0 & 0 & 0 & 0 & 0 \\ 0 & 0 & 0 & 1 & 0 & 0 & 0 & 0 \\ 0 & 0 & 0 & 0 & 0 & 1 & 0 & 0 \end{pmatrix}$

Encode Data x into Codeword c
502

Encoding data $x$ of dimension $k$ using a $C(n,k,d)$ code, wherein the code $C(n,k,d)$ has a length $n$ and a minimum distance $d$, wherein $n = 2^{m_1} + \cdots + 2^{m_s}$, wherein $m_h$, $h = 1,\ldots,s$, is an integer number, on the basis of the equation $c = uA$, wherein $u_i = x_{j_i}$, $0 \leq j_i < k - 1$, if $i \notin F$, wherein $F$ is a set of $n - k$ frozen bit indices of the code $C(n,k,d)$, and $u_i = \sum_{l=0}^{i-1} V_{\phi_i, l} u_{\phi_l}$, if $i \in F$, wherein $V$ is a constraint matrix given by a solution of the equation $WV^T = 0$, wherein $\phi_i$ is an index of a row of the matrix $V$, which has a last non-zero element in column $i$, wherein $W$ is a precoding matrix, and wherein $A$ is defined as follows:
$$A = \begin{pmatrix} A_{m_1} & 0 & \cdots & 0 \\ 0 & A_{m_2} & \cdots & \vdots \\ \vdots & \vdots & \ddots & \vdots \\ 0 & \cdots & 0 & A_{m_s} \end{pmatrix}$$

wherein $A_{m_i} = \begin{pmatrix} 1 & 0 \\ 1 & 1 \end{pmatrix}^{\otimes m_i}$, and wherein $Q^{\otimes m}$ denotes the $m$-times Kronecker product of a matrix $Q$ with itself.

Fig. 5

Decode Codeword c
602

Decoding a codeword $c$ of length $n$ using a $C(n,k,d)$ code, wherein the code $C(n,k,d)$ has a length $n$ and a minimum distance $d$, wherein $n = 2^{m_1} + \ldots + 2^{m_s}$, wherein $m_h$, $h = 1,\ldots,s$, is an integer number, wherein $c = uA$, wherein $u_i = x_{f_i}$, $0 \le f_i \le k-1$, wherein $x$ is data of dimension $k$, if $i \in F$, wherein $F$ is a set of $n-k$ frozen bit indices of the code $C(n,k,d)$ and $u_i = \sum_{j=0}^{i-1} W_{\phi_j,i} u_j$, if $i \in \bar{F}$, wherein $V$ is a constraint matrix given by a solution of the equation $WV^T = 0$, wherein $\phi_i$ is an index of a row of the matrix $V$, which has a last non-zero element in column $i$, wherein $W$ is a precoding matrix, and wherein $A$ is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix}$$

wherein $A_{m_h} = \begin{pmatrix} 1 & 0 \\ 1 & 1 \end{pmatrix}^{\otimes m_h}$, and wherein $Q^{\otimes m}$ denotes the $m$-times Kronecker product of a matrix $Q$ with itself

Fig. 6

CODING AND DECODING OF POLAR CODES EXTENDED TO LENGTHS WHICH ARE NOT POWERS OF TWO

CROSS-REFERENCE TO RELATED APPLICATIONS

This application is a continuation of International Application No. PCT/RU2016/000539, filed on Aug. 12, 2016, the disclosure of which is hereby incorporated by reference in its entirety.

TECHNICAL FIELD

In general, the present application relates to data encoding and decoding in communication systems. In particular, the present application relates to apparatuses and methods for encoding data and decoding data using codes based on polar codes or subcodes.

BACKGROUND

Reliable transmission of data over noisy communication channels usually requires some kind of error correction coding to be used. Polar codes were shown to achieve the Shannon capacity of many channels see E. Arikan, "Channel Polarization: A Method for Constructing Capacity-Achieving Codes for Symmetric Binary-Input Memoryless Channels," IEEE Trans. on Inf. Theory, vol. 55, no. 7, pp. 3051-3073, July 2009). However, the performance of polar codes with practical parameters is often unsatisfactory.

Polar subcodes (see P. Trifonov and V. Miloslayskaya, "Polar subcodes", IEEE Journal on Selected Areas in Communications, 34(2):254-266, February 2016) were shown to have higher minimum distance than classical polar codes, and provide substantially better performance under list, sequential and block sequential decoding (see I. Tal and A. Vardy, "List decoding of polar codes," in Proc. IEEE Int. Symp. Inf. Theory, July 2011, pp. 1-5 and V. Miloslayskaya and P. Trifonov, "Sequential decoding of polar codes," IEEE Commun. Lett., vol. 18, no. 7, pp. 1127-1130, July 2014). However, the performance of polar subcodes can still be improved.

In general, a $(n=2^m, k)$ polar subcode C over GF (2) can be defined as a set of vectors $c=xW A_m$, wherein W represents a k×n precoding matrix, $$A_m = \begin{pmatrix} 1 & 0 \\ 1 & 1 \end{pmatrix}^{\otimes m}$$

represent a polarizing transformation, and $Q^{\otimes m}$ denotes the m-times Kronecker product of a matrix Q with itself. Classical polar codes can be obtained by taking the matrix W, such that each column of W has weight at most 1, and each row has weight 1. Polar subcodes can be obtained by taking W such that the vectors c are also codewords of some parent code which has sufficiently high minimum distance, i.e. $H^T=0$, wherein H is a check matrix of the parent code. For example, it is shown that extended Bose-Chaudhuri-Hocquenghem (BCH) can be good parent codes.

Another equivalent way to define a polar subcode is to consider it as a set of vectors $c=uA$, wherein $uV^T=0$, and wherein V is a (n−k)×n constraint matrix, such that $WV^T=0$. By means of a Gaussian elimination, the matrix V can be constructed in such a way that at most one row ends in each column. Afterwards, the following set of constraints on the input symbols $u_i$ of the polarizing transformation $A_m$ can be obtained:

$$u_{j_i} = \Sigma_{s < j_i, V_{is}=1} u_s, 0 \le i < n-k,$$

wherein $j_i$ is the position of the last non-zero entry in the i-th row of V. The symbols $j_i$ are also denoted dynamic frozen symbols. These dynamic frozen symbols can be considered as a generalization of the concept of (static) frozen symbol used in the construction of classical polar codes. A standard way to construct a polar subcode is to construct a matrix $V=HA^T$, where H is a check matrix of a parent code, and then introduce additional constraints $u_{j_i}=0$ (static freezing constraints) for symbols with the highest error probability $P_{j_i}$, wherein $P_i$ denotes the bit error probability in the synthetic bit subchannel induced by the polarizing transformation $A_m$, wherein a transition probability function can be described as follows:

$$W_m^{(i)}(y_0^{n-1}, u_0^{i-1} | u_i) = \frac{1}{2^{n-1}} \sum_{u_{i+1}^{n-1}} \prod_{j=0}^{n-1} W(y_j | (u_0^{n-1} A_m)_j),$$

wherein W(y|c) is the transition probability function of the underlying binary input memoryless output-symmetric channel, and $a_i^j = (a_i, \ldots, a_j)$.

Another approach to describe polar subcodes is to define a set F of frozen bit indices $j_i$, such that $u_{j_i}$ is either fixed or depends on prior symbols, and to consider a generator matrix G of a parent code. Afterwards, a matrix $W=GA_m^{-1}$ can be computed and a Gaussian elimination can be applied to this matrix, in order to ensure that distinct rows start (i.e. have the first non-zero entry) in different columns, and then the rows with the highest $P_{s_i}$, wherein $s_i$ is the position at which the i-th row starts, can be eliminated from the obtained matrix.

All the above described approaches provide codes of length $2^m$. However, for practical applications, the construction of codes having any code length is desirable.

In order to obtain codes having a length different from $2^m$, several techniques can be applied, for example the so-called shortening and puncturing techniques. According to the shortening technique, given a C(N, K, D) linear block code, a $$(n=N-v, k=K-v, d \ge D)$$

shortened code can be obtained from the code C as a set of vectors $(c_{i_1}, \ldots, c_{i_n}):(c_1, \ldots, c_N) \in C, c_{j_t}=0, j_t \in S, 1 \le t \le v, i_s \notin S, 1 \le s \le n$, wherein S denotes a set of shortened symbols. According to the puncturing technique, given a (N, K, D) linear block code C, a $(n=N-v, k \le K, d \ge D-v)$ punctured code can be obtained from the code C as a set of vectors $(c_{i_1}, \ldots, c_{i_n}):(c_1, \ldots, c_N) \in C, i_t \notin P, 1 \le t \le n$, wherein P denotes a set of punctured symbols. In general, the sets of punctured symbols P and the set of shortened symbols S need to be optimized in order to obtain a satisfying performance of the code and the choice of the sets P and S affects the optimal choice of the set F. Since the sets F, P and S have to be jointly optimized, the construction of the code becomes extremely complex. Moreover, heavily shortened or punctured codes do not have a satisfying performance.

Another way to obtain codes of different lengths is to use concatenation techniques. An example of such techniques is given by the so-called X4 construction described in the work by N. J. A. Sloane et al., "New binary codes," IEEE Trans. On Inform. Theory, vol. IT-18, pp. 503-510, July 1972. This construction is based on linear codes $C_0$ ($n_0$, $k_0$, $d_0$), $C_1$ ($n_0$, $k_1$, $d_1$), $C_2$ ($n_2$, $k_2$, $d_2$), $C_3$ ($n_2$, $k_3$, $d_3$), such that $C_0 \subset C_1$, $C_2 \subset C_3$, $k_1-k_0=k_3-k_2$, and it is assumed that $C_1$ has a generator matrix $G_i$, wherein $$G_1 = \begin{pmatrix} G_0 \\ G' \end{pmatrix}, G_3 = \begin{pmatrix} G_2 \\ G'' \end{pmatrix}.$$

In such a way, an ($n_0+n_2$, $k_0+k_3$, $\min(d_0, d_2, d_1+d_3)$) code having a generator matrix G given by the following equation:

$$G = \begin{pmatrix} G_0 & 0 \\ 0 & G_2 \\ G' & G'' \end{pmatrix}$$

can be obtained. Another example of a concatenation technique is given by the so-called XX construction described in the work by W. Alltop, "A Method for Extending Binary Linear Codes", IEEE Transactions on Information Theory, 30 (6), November 1984, which is based on $C_i(n_i, k_i, d_i)$, i=1, ... , 6, codes, wherein $$C_1 = C_2 + C_3, C_4 = C_2 \cap C_3, \text{ i.e. } G_2 = \begin{pmatrix} G' \\ G_4 \end{pmatrix}, G_3 = \begin{pmatrix} G'' \\ G_4 \end{pmatrix},$$

$$G_1 = \begin{pmatrix} G' \\ G'' \\ G_4 \end{pmatrix}, k_5 = k_2 - k_4, k_6 = k_3 - k_4.$$

By means of these codes, an ($n_1+n_5+n_6$, $k_1$, $\min(d_4, d_2+d_5, d_3+d_6, d_1+d_5+d_6)$) code having a generator matrix G given by the following equation:

$$G = \begin{pmatrix} G' & G_5 & 0 \\ G'' & 0 & G_6 \\ G_4 & 0 & 0 \end{pmatrix}$$

can be obtained. However, the performance of the codes obtained by means of concatenation techniques still can significantly be improved.

Thus, there is a need for improved apparatuses and methods for encoding data and decoding data using codes based on polar codes or subcodes.

SUMMARY

It is an object of the application to provide improved apparatuses and methods for encoding data and decoding data using codes based on polar codes or subcodes as well as to specify these codes in an efficient way.

The foregoing and other objects are achieved by the subject matter of the independent claims. Further implementation forms are apparent from the dependent claims, the description and the figures.

According to a first aspect the application relates to an encoding apparatus for encoding data x of dimension k into a codeword c of length n. The encoding apparatus comprises a processor configured to encode the data x using a C(n, k, d) code, wherein the code C(n, k, d) has a length n and a minimum distance d, wherein $n=2^{m_1}+\ldots+2^{m_s}$, wherein $m_h$, h=1, ... , s, is an integer number, on the basis of the equation:

$$c = uA,$$

wherein $u_i=x_{j_i}$, $0 \leq j_i < k-1$, if $i \notin F$, wherein F is a set of n-k frozen bit indices of the code C(n, k, d), and $u_i = \sum_{s=0}^{i-1} \mathbb{V}_{\phi_i,s} u_s$, if $i \in F$, wherein $\mathbb{V}$ is a constraint matrix given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

In a first possible implementation form of the encoding apparatus according to the first aspect as such, the processor is further configured to construct the code C(n, k, d) on the basis of a plurality of nested linear block codes $C_{ij}(2^{m_i}, K_{i,j}, d_{ij})$, $K_{i,j+1} > K_{i,j}$, $0 \leq j < \tau_i$, wherein $\tau_i$ is a positive integer, wherein a generator matrix of $C_{ij}(2^{m_i}, K_{i,j}, d_{ij})$ is given by the equation:

$$G^{(i,j)} = \begin{pmatrix} G^{(i,0)} \\ G^{(i,1)} \\ \vdots \\ G^{(i,j)} \end{pmatrix},$$

wherein $G^{(i,j)}$ is a $k_{i,j} \times 2^{m_i}$ matrix, $K_{i,j} = \sum_{s=0}^{j} k_{i,s}$, wherein a precoding matrix of $G^{(i,j)}$ is defined by $$W^{(i,j)} = G^{(i,j)} \begin{pmatrix} 1 & 0 \\ 1 & 1 \end{pmatrix}^{\otimes i},$$

wherein a precoding matrix of $\tilde{G}^{(i,g)}$ is defined by $$\tilde{W}^{(i,j)} = \tilde{G}^{(i,j)} \begin{pmatrix} 1 & 0 \\ 1 & 1 \end{pmatrix}^{\otimes i},$$

wherein an index $l_{i,p}$ of a column, where a p-th row of the matrix $\tilde{W}^{(i,\tau_i-1)}$ starts, is defined by the equation $$l_{i,p} = \min_{\substack{0 \le t < 2^i \\ W_{p,t}^{(i,\tau_i-1)}=1}} t, \; 0 \le p < 2^{m_i},$$

and to construct the precoding matrix $\mathbb{W}$ as a block matrix, wherein the blocks of the precoding matrix $\mathbb{W}$ consist of selected rows of the matrices $\tilde{W}^{(i,j)}$.

In a second possible implementation form of the encoding apparatus according to the first implementation form of the first aspect, the plurality of nested linear block codes $C_{i,j}(2^{m_i}, K_{i,j}, d_{i,j})$ are extended Bose-Chaudhuri-Hocquenghem (e-BCH) codes.

In a third possible implementation form of the encoding apparatus according to the first aspect as such or any one of the first to second implementation form thereof, the processor is further configured to construct a precoding matrix $\widetilde{\mathbb{W}}$ of the code C(n, k, d) as follows:

$$\tilde{W} = \begin{pmatrix} \tilde{W}^{(1,r_1)} & 0 & 0 & \cdots & 0 \\ 0 & \tilde{W}^{(2,r_2)} & 0 & \cdots & 0 \\ 0 & 0 & \tilde{W}^{(3,r_3)} & \cdots & 0 \\ \vdots & \vdots & \vdots & \ddots & \vdots \\ 0 & 0 & 0 & \cdots & \tilde{W}^{(s,r_s)} \\ W^{(1,r_1+1)} & \hat{W}^{(2,1)} & \hat{W}^{(3,1)} & \cdots & \hat{W}^{(s,1)} \\ 0 & W^{(2,r_2+1)} & \hat{W}^{(3,2)} & \cdots & \hat{W}^{(s,2)} \\ \vdots & \vdots & \vdots & \ddots & \vdots \end{pmatrix},$$

wherein $r_i = \max_{j:d_{i,j} \ge d} j$ is an index of a largest e-BCH code of length $2^{m_i}$ having a minimum distance of at least d and wherein $\hat{W}^{(i,j)}$ is a matrix defined on the basis of the matrix $\tilde{W}$.

In a fourth possible implementation form of the encoding apparatus according to any one of the first to third implementation form of the first aspect, the processor is further configured to construct the matrix $\hat{W}^{(i,j)}$ by means of rows of the matrix $\tilde{W}^{(i,\tau_j)}$ having the smallest value of $P_{m_i,l_{i,p}}$, wherein $P_{m,i}$ is an error probability in a bit subchannel $W_m^{(i)}(y_0^{2^m-1}, u_0^{i-1}|u_i)$, wherein $y_0^{2^m-1} = y_0 \ldots y_{2^m-1}$ denotes $2^m-1$ noisy symbols of the codeword c after a transmission over a communication channel.

In a fifth possible implementation form of the encoding apparatus according to the first aspect as such or any one of the first to fourth implementation form thereof, the processor is further configured to construct a first plurality of t rows of the matrix $\mathbb{V}$ in such a way that the last non-zero elements in the first plurality of t rows are located in distinct positions j, $j \ge j_0$ for some integer $j_0$, wherein the number of non-zero bits in the binary expansion of the integer j is set equal to $w_0$, to construct elements of the first plurality of t rows located in columns having an index z<j by means of a pseudorandom number generator, and to construct a second plurality of n−k−t rows of matrix $\mathbb{V}$ as distinct weight-one rows.

In a sixth possible implementation form of the encoding apparatus according to the fifth implementation form of the first aspect, the pseudorandom number generator is a linear feedback shift register.

In a seventh possible implementation form of the encoding apparatus according to any one of the first to sixth implementation form of the first aspect, the processor is further configured to arrange the rows of the matrix $W^{(i,r_i+1)}$ or $\hat{W}^{(j,i)}$ in an ascending order of the values $l_{i,p}$ and $1_{j,p}$ respectively.

In an eighth possible implementation form of the encoding apparatus according to any one of the first to seventh implementation form of the first aspect, the processor is configured to construct the matrix $\mathbb{W}$ based on k rows of the matrix $\widetilde{\mathbb{W}}$ with the smallest values of $l_{i,p}$.

According to a second aspect the application relates to a method for encoding data x of dimension k into a codeword c of length n. The method comprises the step of encoding the data x using a C(n, k, d) code, wherein the code C(n, k, d) has a length n and a minimum distance d, wherein $n = 2^{m_1} + \ldots + 2^{m_s}$, wherein $m_h$, h=1, . . . , s, is an integer number, on the basis of the equation:

$$c = uA,$$

wherein $u_i = x_{j_i}$, $0 \le j_i < k-1$, if $i \notin F$, wherein F is a set of n−k frozen bit indices of the code C(n, k, d), and $u_i = \sum_{s=0}^{i-1} \mathbb{V}_{\phi_i,s} u_s$, if $i \in F$, wherein $\mathbb{V}$ is a constraint matrix given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

The method according to the second aspect of the application can be performed by the encoding apparatus according to the first aspect of the application. Further features of the method according to the second aspect of the application result directly from the functionality of the encoding apparatus according to the first aspect of the application and its different implementation forms.

According to a third aspect the application relates to a decoding apparatus for decoding a codeword c of length n. The decoding apparatus comprises a processor configured to decode the codeword c using a C(n, k, d) code, wherein the code C(n, k, d) has a length n and a minimum distance d, wherein $n = 2^{m_1} + \ldots + 2^{m_s}$, wherein $m_h$, h=1, . . . , s, is an integer number, wherein:

$$c = uA,$$

wherein $u_i = x_{j_i}$, $0 \le j_i < k-1$, wherein x is data of dimension k, if $i \notin F$, wherein F is a set of n−k frozen bit indices of the code C(n, k, d) and $u_i = \sum_{s=0}^{i-1} \mathbb{V}_{\phi_i,s} u_s$, if $i \in F$, wherein $\mathbb{V}$ is a constraint matrix given by a solution of the equation:

$$\mathbb{W} \mathbb{V}^T = 0,$$

wherein $\phi_i$ is an index of a row of the matrix $V$, which has a last non-zero element in column i, wherein $W$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

In a first possible implementation form of the decoding apparatus according to the third aspect as such, the processor is further configured to decode the codeword c by means of a generalization of a successive cancellation algorithm.

In a second possible implementation form of the decoding apparatus according to the first implementation form of the third aspect, the processor is further configured to compute u by means of the following equations:

$$\hat{u}_i = \Sigma_{s=0}^{i-1} V_{\phi_i,s} \hat{u}_s, \text{ if } i \in F$$

and $$\hat{u}_i = \arg\max_{u_i} W_{\mu_i}^{(i \bmod 2^{\mu_i})}(y_{t_i}^{2^{\mu_i+t_i-1}}, \hat{u}_{t_i}^{i-1}|u_i), \text{ if } i \notin F$$

wherein $\phi_i$ is an index of a row of the matrix $V$, which has a last non-zero element in column i, wherein $y_0^{n-1} = y_0 \ldots y_{n-1}$ denotes n noisy symbols of the codeword c after a transmission over a communication channel to the decoding apparatus, $\mu_i = \lfloor \log_2(2^{\lceil \log_2 n \rceil} - i) \rfloor$, and $t_i = 2^{\lceil \log_2 n \rceil} - 2^{\mu_i + 1}$.

In a third possible implementation form of the decoding apparatus according to the second implementation form of the third aspect, the processor is further configured to compute $\hat{u}_{i_1}$ before $\hat{u}_{i_2}$, if $\mu_{i_1} = \mu_{i_2}$ and $i_1 < i_2$, and to compute $\hat{u}_s$: $V_{\phi_i,s} \neq 0$, $s < i$, before $\hat{u}_i$, if $i \in F$.

According to a fourth aspect, the application relates to a method for decoding a codeword c of length n, wherein the method comprises the step of decoding the codeword c using a C(n, k, d) code, wherein the code C(n, k, d) has a length n and a minimum distance d, wherein $n = 2^{m_1} + \cdots + 2^{m_s}$, wherein $m_h$, h=1, ..., s, is an integer number, wherein:

$$c = uA,$$

wherein $u_j = x_j$, $0 \leq j < k-1$, wherein x is data of dimension k, if $i \notin F$, wherein F is a set of n–k frozen bit indices of the code C(n, k, d) and $u_i = \Sigma_{s=0}^{i-1} V_{\phi_i,s}$, if $i \in F$, wherein $V$ is a constraint matrix given by a solution of the equation:

$$W V^T = 0,$$

wherein $\phi_i$ is an index of a row of the matrix $V$, which has a last non-zero element in column i, wherein $W$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

The method according to the fourth aspect of the application can be performed by the decoding apparatus according to the third aspect of the application. Further features of the method according to the fourth aspect of the application result directly from the functionality of the decoding apparatus according to the third aspect of the application and its different implementation forms.

According to a fifth aspect, the application relates to a computer program comprising a program code for performing the method according to the second aspect of the application and the method according to the fourth aspect of the application when executed on a computer.

The application can be implemented in hardware and/or software.

BRIEF DESCRIPTION OF THE DRAWINGS

Further embodiments of the application will be described with respect to the following figures, wherein:

FIG. 1a shows four exemplary generator matrices of extended BHC codes used to construct a code according to an embodiment;

FIG. 1b shows three exemplary generator matrices of extended BHC codes used to construct a code according to an embodiment;

FIG. 1c shows four exemplary precoding matrices of generator matrices of extended BHC codes used to construct a code according to an embodiment;

FIG. 1d shows three exemplary precoding matrices of generator matrices of extended BHC codes used to construct a code according to an embodiment;

FIG. 1e shows an exemplary precoding matrix of a parent code according to an embodiment;

FIG. 1f shows an exemplary precoding matrix of a code according to an embodiment;

FIG. 1g shows an exemplary constraint matrix of a code according to an embodiment;

FIG. 5 shows a schematic diagram of a method for encoding data x of dimension k into a codeword c of length n according to an embodiment; and FIG. 6 shows a schematic diagram of a method for decoding a codeword c of length n according to an embodiment.

In the figures, identical reference signs will be used for identical or functionally equivalent features.

DETAILED DESCRIPTION OF ILLUSTRATIVE EMBODIMENTS

In the following description, reference is made to the accompanying drawings, which form part of the disclosure, and in which are shown, by way of illustration, specific aspects in which the present application may be placed. It will be appreciated that the application may be placed in other aspects and that structural or logical changes may be made without departing from the scope of the application. The following detailed description, therefore, is not to be taken in a limiting sense, as the scope of the application is defined by the appended claims.

For instance, it will be appreciated that a disclosure in connection with a described method will generally also hold true for a corresponding device or system configured to perform the method and vice versa. For example, if a specific method step is described, a corresponding device may include a unit to perform the described method step, even if such unit is not explicitly described or illustrated in the figures.

Moreover, in the following detailed description as well as in the claims, embodiments with functional blocks or processing units are described, which are connected with each other or exchange signals. It will be appreciated that the application also covers embodiments which include additional functional blocks or processing units that are arranged between the functional blocks or processing units of the embodiments described below.

Finally, it is understood that the features of the various exemplary aspects described herein may be combined with each other, unless specifically noted otherwise.

Figure 1:
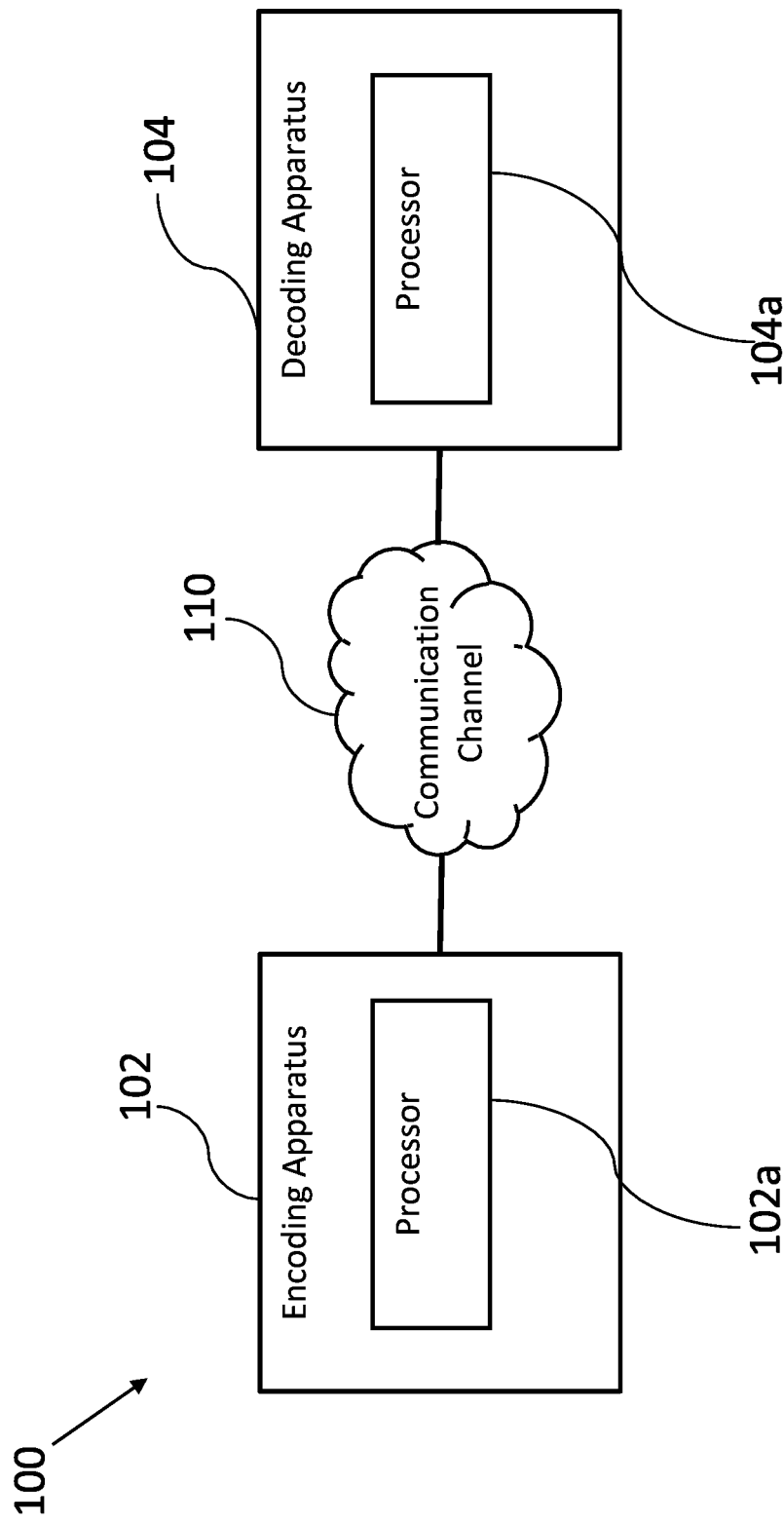
FIG. 1 shows a schematic diagram illustrating a communication system comprising an encoding apparatus according to an embodiment and a decoding apparatus according to an embodiment.

FIG. 1 shows a schematic diagram illustrating a communication system 100 comprising an encoding apparatus 102 and a decoding apparatus 104, which can communicate via a communication channel 110.

The encoding apparatus 102 comprises a processor iota and is configured to encode data. Likewise, the decoding apparatus 104 comprises a processor 104a and is configured to decode data, in particular data encoded by the encoding apparatus 102. The encoding apparatus 102 and/or the decoding apparatus 104 can be implemented as part of a communication device, such as a mobile phone or a base station of a cellular communication network.

In an embodiment, the processor iota is configured to encode data x of dimension k into a codeword c of length n using a C(n, k, d) code, wherein the code C(n, k, d) has a length n and a minimum distance d, wherein $n=2^{m_1}+\ldots+2^{m_s}$, wherein $m_h > m_{h+1}$, $h=1, \ldots, s$, is an integer number, on the basis of the equation:

$$c = uA,$$

wherein $u_i = x_{j_i}$, $0 \leq j_i < k-1$, if $i \notin F$, wherein F is a set of n−k frozen bit indices of the code C(n, k, d), and $u_i = \Sigma_{s=0}^{i-1} \mathbb{V}_{\phi_i,s} u_s$, if $i \in F$, wherein V is a constraint matrix. The constraint matrix V is given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \ldots & 0 \\ 0 & A_{m_2} & \ldots & 0 \\ \vdots & \vdots & \ddots & \vdots \\ 0 & 0 & \ldots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

In an embodiment, similarly to the processor iota, the processor 104a of the decoding apparatus 104 is configured to decode the codeword c using a C(n, k, d) code, wherein the code C(n, k, d) has a length n and a minimum distance d, wherein $n=2^{m_1}+\ldots+2^{m_s}$, wherein $m_h > m_{h+1}$ $h=1, \ldots, s$, is an integer number, wherein:

$$c = uA,$$

wherein $u_i = x_{j_i}$, $0 \leq j < k-1$, wherein x is data of dimension k, if $i \notin F$, wherein F is a set of n−k frozen bit indices of the code C(n, k, d) and $u_i = \Sigma_{s=0}^{i-1} \mathbb{V}_{\phi_i,s} u_s$, if $i \in F$, wherein $\mathbb{V}$ is a constraint matrix given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \ldots & 0 \\ 0 & A_{m_2} & \ldots & 0 \\ \vdots & \vdots & \ddots & \vdots \\ 0 & 0 & \ldots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

The communication channel 110 can be a wired or a wireless communication channel.

In an embodiment, the processor iota can be configured to generate the constraint matrix $\mathbb{V}$ on the basis of the following steps.

$1^{st}$ step: construct generator matrices $$\tilde{G}^{(i,j)} = \begin{pmatrix} G^{(i,0)} \\ G^{(i,1)} \\ \vdots \\ G^{(i,j)} \end{pmatrix}$$

of nested extended primitive narrow-sense BCH codes $C_{i,j}$ $(2^{m_i}, K_{i,j}, d_{i,j})$, $0 \le j < \tau_i$, wherein $G^{(i,j)}$ is a $k_{i,j}$-$2^{m_i}$ matrix, $K_{i,j} = \sum_{s=0}^{j} k_{i,s}$, and define the corresponding precoding matrices of $G^{(i,j)}$ as:

$$\tilde{W}^{(i,j)} = \tilde{G}^{(i,j)} \begin{pmatrix} 1 & 0 \\ 1 & 1 \end{pmatrix}^{\otimes m_i} \text{ and } W^{(i,j)} = G^{(i,j)} \begin{pmatrix} 1 & 0 \\ 1 & 1 \end{pmatrix}^{\otimes i},$$

wherein an index of a column where the $p^{th}$ row of the matrix $\tilde{W}^{(i,\tau_i-1)}$ starts is defined by:

$$l_{i,p} = \min_{\tilde{W}^{(i,\tau_i-1)}_{p,t}=1} 0 \le t < 2^i \, t, \, 0 \le p < 2^{m_i}.$$

In an embodiment, it can be assumed that for any i all $l_{i,p}$ are distinct and, in general, the integer number $\tau_i$ is equal to the number of irreducible polynomials of degree M, wherein M represents the number of divisors of $m_i$.

$2^{nd}$ step: apply elementary row operations to $\tilde{W}^{(i,j)}$ in order to ensure that all rows start in distinct columns, while preserving the nested structure of the matrices $\tilde{W}^{(i,j)}$.

$3^{rd}$ step: select rows of matrices $\tilde{W}^{(i,j)}$:$d_{i,j} \ge d$, and put them into the i-th column of a precoding matrix $\widetilde{W}$, wherein the precoding matrix $\widetilde{W}$ is a block matrix.

$4^{th}$ step: select rows of matrices $\tilde{W}^{(i,j)}$:$d > d_{i,j} \ge d - \epsilon$ for some $\epsilon > 0$, put them into the i-th column of the precoding matrix $\widetilde{W}$. For every such a row, select a row of a matrix $\tilde{W}^{(i',j')}$,i'>i,$d_{i',j'} \ge \epsilon$, which has not been selected in the previous step, and put it into the same row of matrix $\widetilde{W}$ in column i'. Summarizing, the constructed precoding matrix $\widetilde{W}$ is given by:

$$\tilde{W} = \begin{pmatrix} \tilde{W}^{(1,r_1)} & 0 & 0 & \cdots & 0 \\ 0 & \tilde{W}^{(2,r_2)} & 0 & \cdots & 0 \\ 0 & 0 & \tilde{W}^{(3,r_3)} & \cdots & 0 \\ \vdots & \vdots & \vdots & \ddots & \vdots \\ 0 & 0 & 0 & \cdots & \tilde{W}^{(s,r_s)} \\ W^{(1,r_1+1)} & \hat{W}^{(2,1)} & \hat{W}^{(3,1)} & \cdots & \hat{W}^{(s,1)} \\ 0 & W^{(2,r_2+1)} & \hat{W}^{(3,2)} & \cdots & \hat{W}^{(s,2)} \\ \vdots & \vdots & \vdots & \ddots & \vdots \end{pmatrix},$$

wherein $r_i = \max_{j:d_{i,j} \ge d} j$ is an index of a largest e-BCH code of length $2^{m_i}$ with minimum distance d and $\delta_i = d - d_{i,r_i+1}$ is the minimum distance difference of the next largest e-BCH code. The matrices $\hat{W}^{(i,j)}$ consist of some rows of matrix $\tilde{W}^{(i,\tau_j)}$ and zero rows, wherein $\tau_j = \max_{s:d_{i,s} \ge \delta_j} s$, so that for any s there is at most one block i with non-zero row $\hat{W}^{(i,j)}_{s,\_}$.

$5^{th}$ step: keep k rows of matrix $\widetilde{W}$ which start in column $l_{i,p}$ of block i with the smallest where $P_{m_i,l_{i,p}}$ is the error probability in a bit subchannel $W_m^{(i)}(y_0^{2^m-1}, u_0^{i-1}|u_i)$, wherein $y_0^{2^m-1} = y_0 \ldots y_{2^m-1}$ denotes $2^m-1$ noisy symbols of the codeword c after a transmission over the communication channel 110. Let $\mathbb{W}$ be the obtained matrix.

$6^{th}$ step: obtain $\mathbb{V}$: $\mathbb{W} \mathbb{V}^T = 0$, use Gaussian elimination to ensure that rows of $\mathbb{V}$ end in distinct columns $j_i$, $0 \le i < n-k$ and define the set of (dynamic) frozen bit indices as $F = \{j_i, 0 \le i < n-k\}$.

Figure 1E:
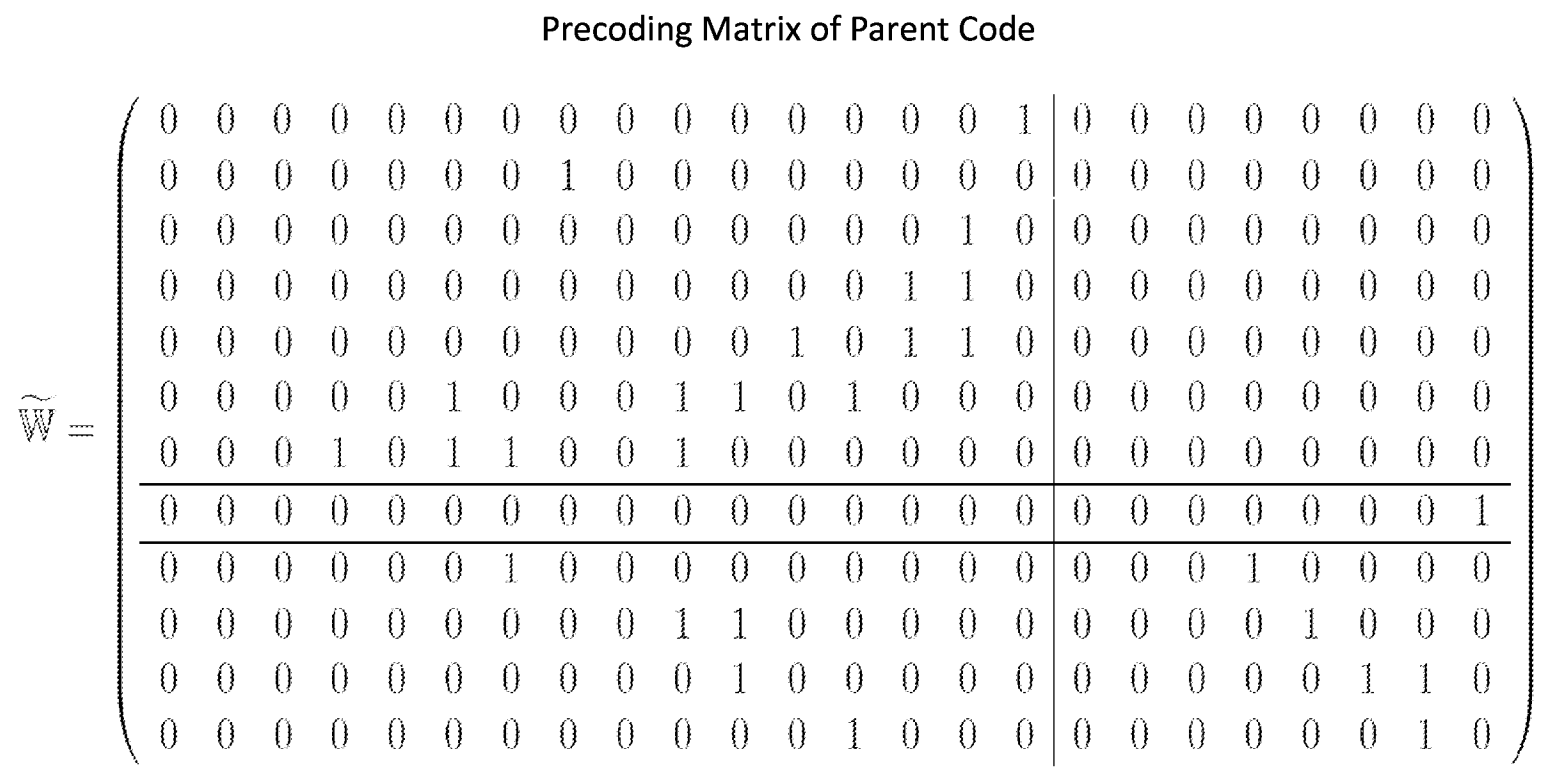

In order to illustrate the above described steps to generate the constraint matrix $\mathbb{V}$, the construction of an exemplary (24,11,6) code on the basis of chained polar subcodes is considered. In this case, the code has dimension n=24, which can also be written as $24 = 2^4 + 2^3$, so that $m_0 = 4$, $m_1 = 3$. In FIGS. 1a and 1b, the nested generator matrices $G^{(i,j)}$, i=0, 1 and j=1, 2, 3, of the corresponding extended BCH codes $C_{i,j}$ are shown, wherein $d_{0,0}=16$, $d_{0,1}=8$, $d_{0,2}=6$, $d_{0,3}=4$, $d_{1,0}=8$, $d_{1,1}=4$, $d_{1,2}=2$. By multiplying the matrices $G^{(i,j)}$ shown in FIGS. 1a and 1b by the matrices $$A_{m_i} = \begin{pmatrix} 1 & 0 \\ 1 & 1 \end{pmatrix}^{\otimes m_i},$$

and by applying elementary row operations, the corresponding precoding matrices $W^{(i,j)}$ can be obtained, as shown in FIGS. 1c and 1d. Combining the precoding matrices $W^{(i,j)}$ with $\epsilon=2$, the precoding matrix $\widetilde{W}$ of the parent code can be obtained as shown in FIG. 1e. In the case of a binary erasure channel having erasure probability 0.5, the error probabilities in bit subchannels are for instance: 0.499, 0.496, 0.492, 0.386, 0.48, 0.32, 0.26, 0.5e-1, 0.44, 0.23, 0.17, 0.18e-1, 0.11, 0.38e-2, 0.76e-5; 0.498, 0.44, 0.40, 0.15, 0.34, 0.09, 0.06, 0.0019.

Figure 1F:
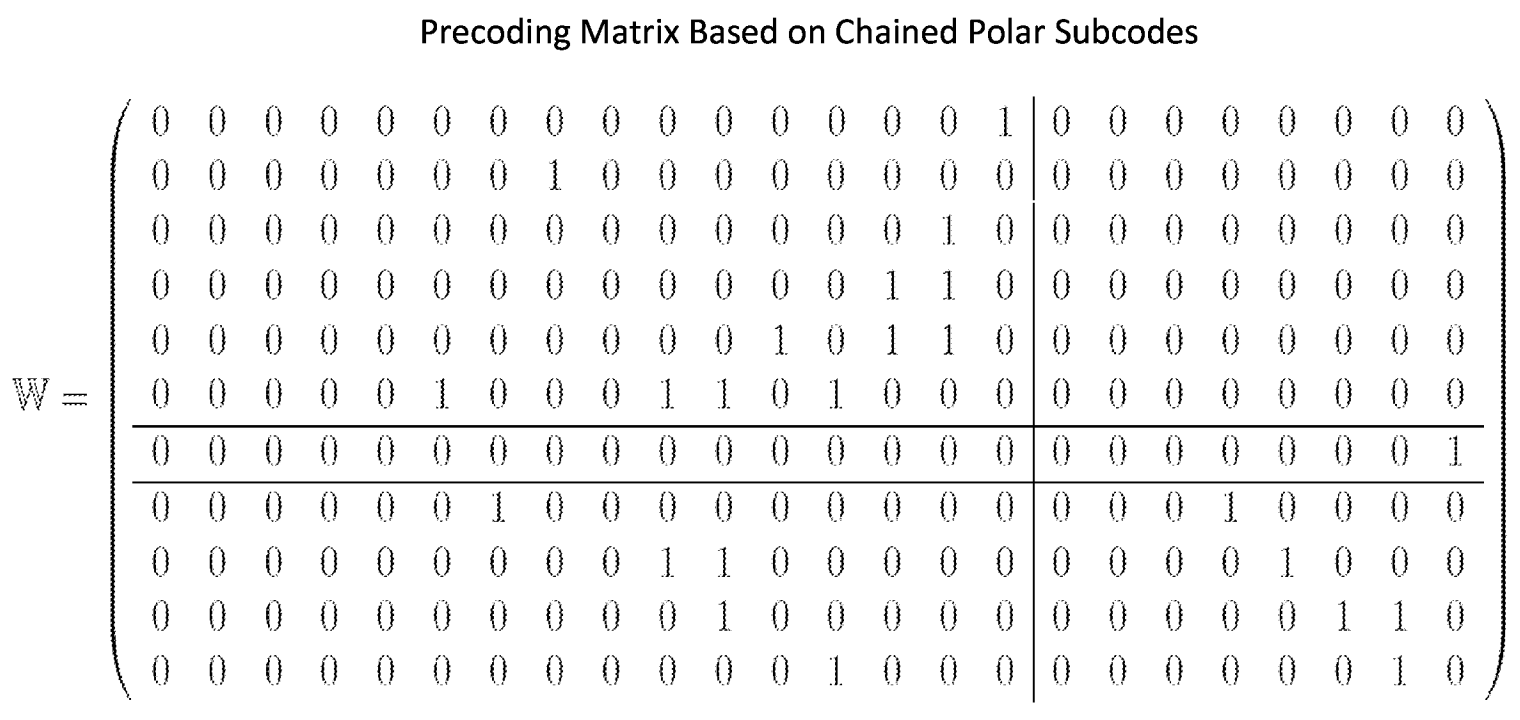
Figure 1G:
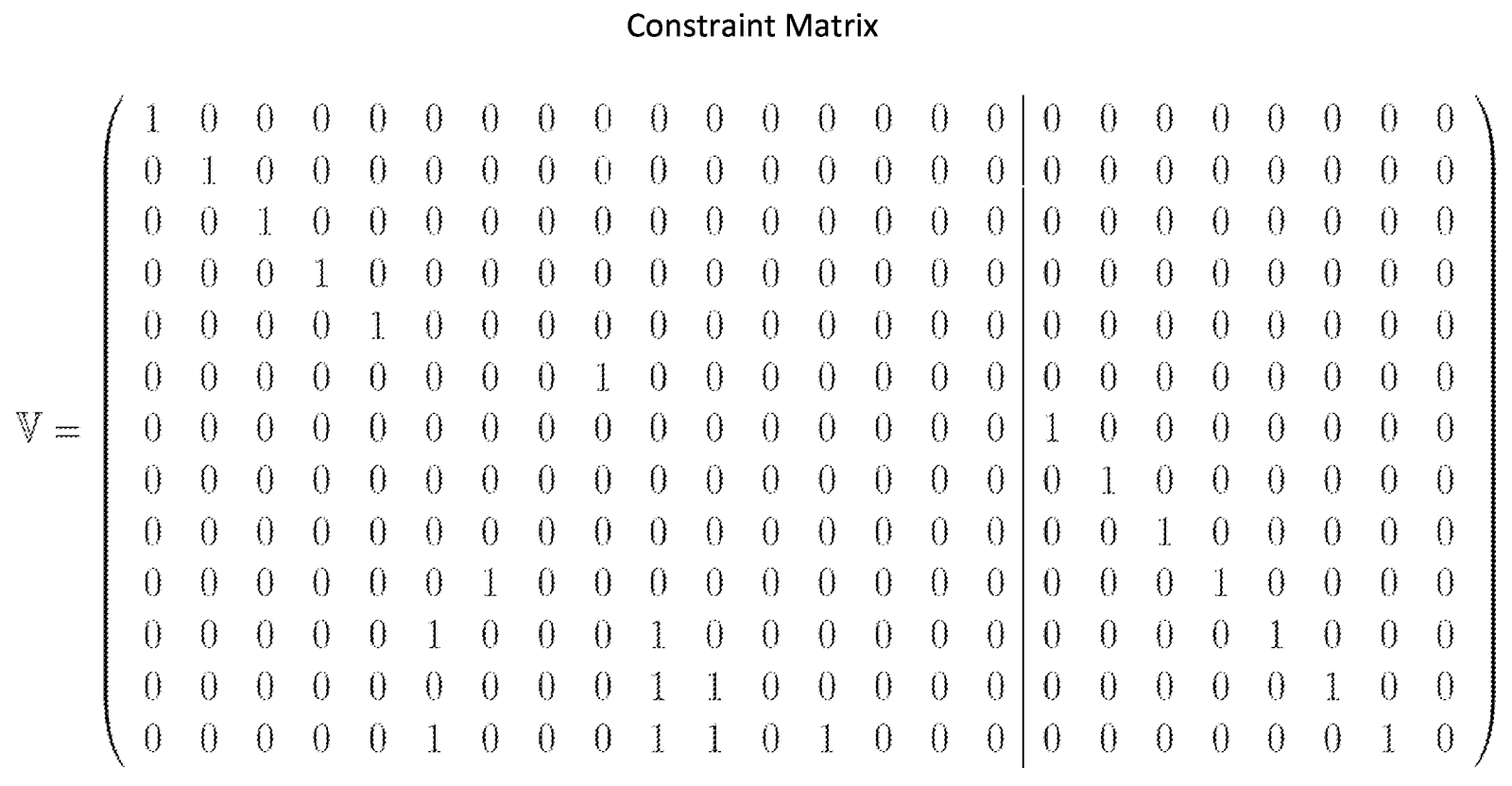

Since the $6^{th}$ row of the matrix $\widetilde{W}$ starts in column 3, which corresponds to a subchannel with the highest error probability 0.386, it can be eliminated. Therefore, a precoding matrix $\mathbb{W}$ for the (24,11,6) code based on chained polar subcodes can be obtained as shown in figure 1f. Finally, the corresponding constraint matrix $\mathbb{V}$ can be obtained as shown in FIG. 1g.

In another embodiment the processor 102a can be configured to construct the (n-k)×n matrix $\mathbb{V}$, according to the following steps:

$1^{st}$ step: set the rows of V to distinct vectors of weight 1, containing 1 in columns $l_{i,p}$ of block i with the highest $P_{m_i,l_{i,p}}$; and $2^{nd}$ step: put arbitrary binary values into columns j<$l_{i,p}$ of at most two blocks i, for each of the last ρ rows of $\mathbb{V}$.

In an embodiment, the binary values can be obtained by a pseudo-random number generator (PRNG), such as a linear feedback shift register. This has the advantage that the code can be specified in a compact way by providing just the parameters and seed value of the PRNG. Furthermore, the matrix $\mathbb{V}$ constructed according to the above mentioned steps has the advantage of providing chained polar subcodes which have a high performance.

Once the matrices $\mathbb{W}$ and $\mathbb{V}$ are available, in another embodiment, the processor 102a can further be configured to encode the data x of dimension k into the codeword c according to the following equation:

$$c = x\mathbb{W}A, \, A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix}.$$

Furthermore, once the codeword c is encoded, it can be sent to the decoding apparatus 104 via the communication channel 110. However, after the transmission over the communication channel 110, the n symbols of the codeword c are affected by noise and they result in noisy symbols $y_0^{n-1} = y_0 \ldots y_{n-1}$, therefore a method is needed in order to recover the correct symbols of the codeword c.

In an embodiment, the processor 104*a* of the decoding apparatus 104 can be configured to recover the codeword c using a generalized successive cancellation algorithm and its list or sequential extensions on the basis of the following equations:

$$\hat{u}_i = \Sigma_{s=0}^{i-1} \mathbb{V}_{\phi_i,s} \hat{u}_s, i \in F \quad \text{and} \quad \hat{u}_i = \arg \max_{u_i} W_{\mu_i}^{(i \bmod 2^{\mu_i})} (y_{t_i}^{2^{\mu_i}+t_i-1}, \hat{u}_{t_i}^{i-1} | u_i), i \notin F$$

wherein $\mu_i = \lfloor \log_2(2^{\lceil \log_2 n \rceil} - i) \rfloor$ and $t_i = 2^{\lceil \log_2 n \rceil} - 2^{\mu_i + 1}$.

This decoding method can also be extended to obtain list and sequential successive cancellation methods similar to the ones presented in the aforementioned works by Tal and Vardy and Miloslayskaya and Trifonov.

In an embodiment the order to obtain the symbol 11, can be rearranged on the basis of the following rules:

a. If $\mu_{i_1} = \mu_{i_2}$ and $i_1 < i_2$, then $\hat{u}_{i_1}$ is calculated before $\hat{u}_{i_2}$; and b. If $i \in F$, then $\hat{u}_s : \mathbb{V}_{\phi_i,s} \neq 0$, $s < i$, is calculated before $\hat{u}_i$.

Rearranging the detection order of symbols $\hat{u}_i$ has the advantage that it can lead to an improved performance of list and sequential successive cancellation algorithms.

Figure 2:
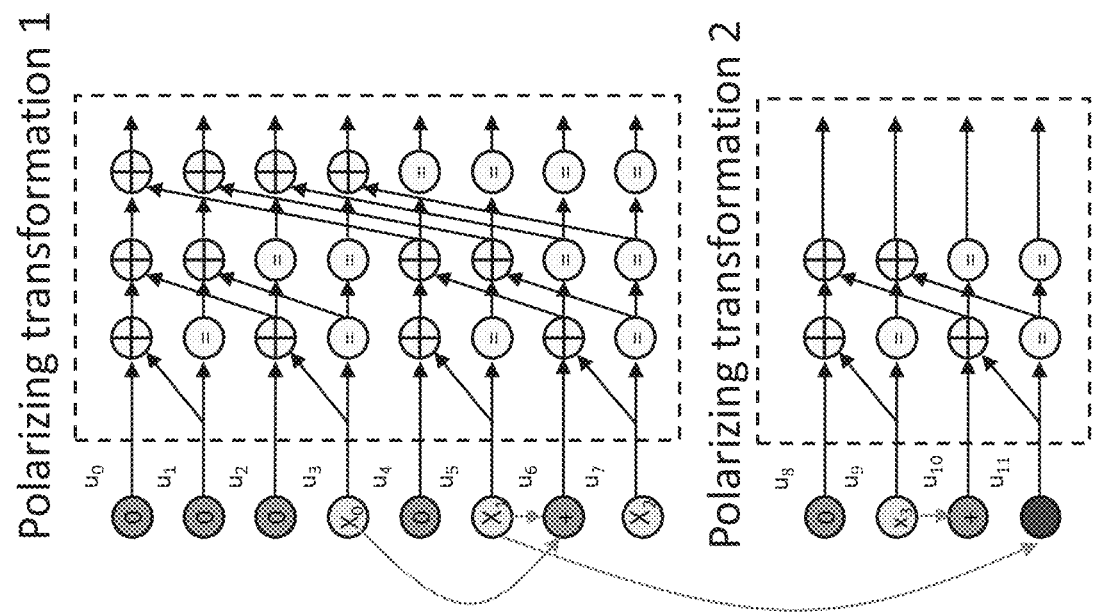
FIG. 2 shows a schematic diagram of a structure of an encoding apparatus for a code based on chained polar subcode according to an embodiment.

FIG. 2 shows a schematic diagram of a structure of an encoding apparatus 102 for a code based on chained polar subcode according to an embodiment. In this embodiment, the code has a length $n = 12 = 2^3 + 2^2$ and it includes two polarizing transformations: $A_{m_1}$, $m_1 = 3$, (polarizing transformation 1) of size 8 and $A_{m_2}$, $m_2 = 2$, (polarizing transformation 2) of size 4. The data x of dimension 4 to be encoded is represented by the four symbols $x_0$, $x_1$, $x_2$, $x_3$, which are mapped onto symbols $u_3$, $u_5$, $u_7$, $u_9$. The set of frozen bit symbols is represented by $u_0$, $u_1$, $u_2$, $u_4$, $u_6$, $u_8$, $u_{10}$, $u_{11}$. In an embodiment, the processor iota of the encoding apparatus 102 can be configured to calculate symbols $u_6$ and $u_{10}$ as a function of some linear combinations of other input symbols of the corresponding polarizing transformations as shown in FIG. 2. Furthermore, the processor iota can be configured to calculate the input symbol $u_{11}$ of the polarizing transformation 2 as a function of an input symbol of the polarizing transformation 1. Moreover, the structure of the freezing and cross-coding constraints can be realized in such a way that the obtained code has sufficiently high minimum distance and it can be decoded in an efficient way by a possible generalization or modification of the successive cancellation algorithm.

Figure 3:
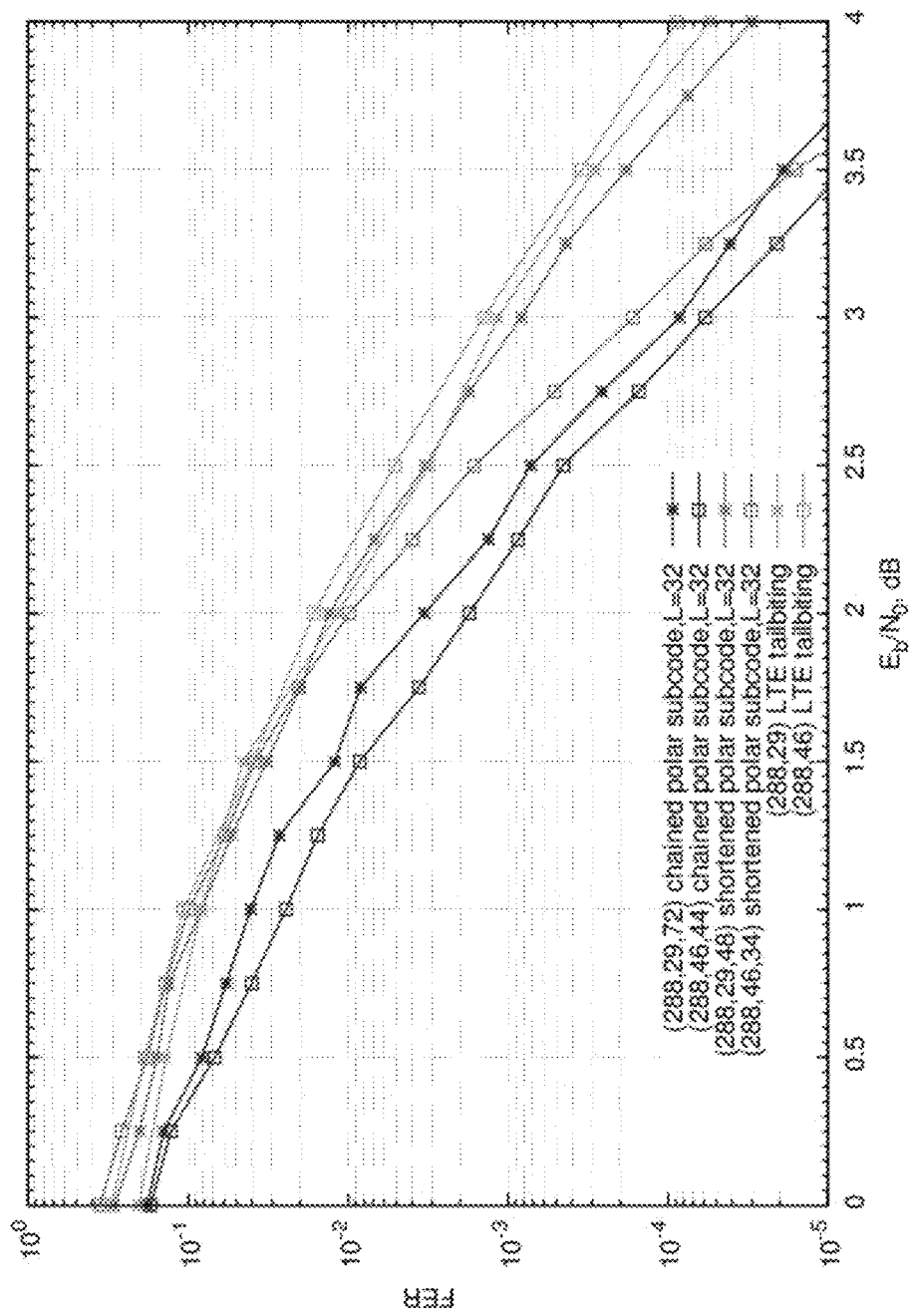
FIG. 3 shows frame error rates (FER) of different codes as a function of a signal-to-noise ratio ($E_b/N_0$) in dB according to an embodiment.

FIG. 3 shows a frame error rate (FER) of different codes as a function of a signal-to-noise ratio ($E_b/N_0$) in dB according to an embodiment. As it is shown in FIG. 3, the performance of codes based on chained polar subcodes under a sequential decoding algorithm can significantly be improved compared to the performance of shortened polar subcodes, turbo codes and convolutional LTE tailbiting codes. In particular, codes based on chained polar subcodes can provide up to 0.3-0.7 dB power gain compared to shortened polar subcodes.

Figure 4:
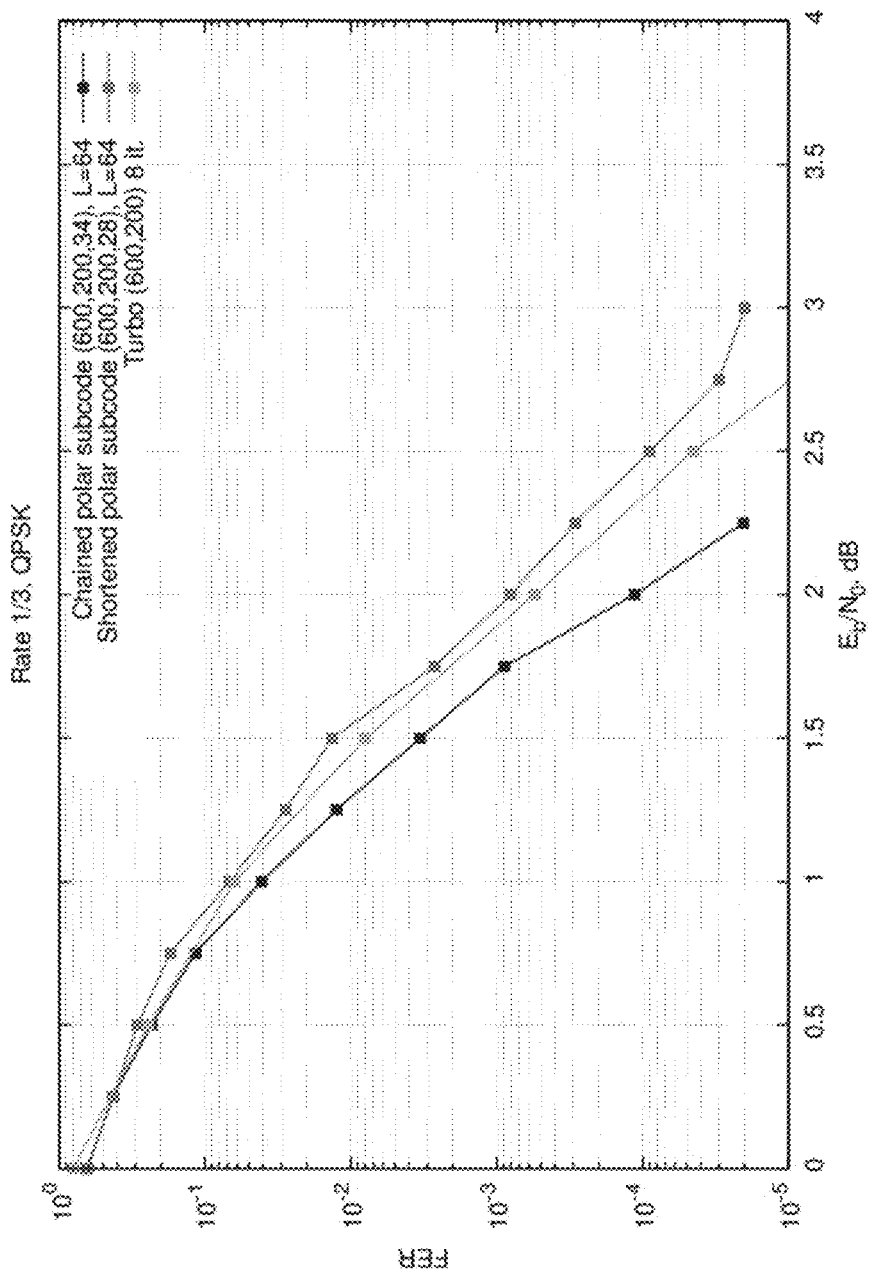
FIG. 4 shows frame error rates (FER) of different codes as a function of a signal-to-noise ratio ($E_b/N_0$) in dB according to an embodiment.

FIG. 4 shows a frame error rate (FER) of different codes as a function of a signal-to-noise ratio ($E_b/N_0$) in dB according to an embodiment. Analogously to FIG. 3, in this case as well, the performance of codes based on chained polar subcodes is significantly improved compared to the performance of shortened polar subcodes and turbo codes.

FIG. 5 shows a schematic diagram of a method 500 for encoding data x of dimension k into a codeword c of length n according to an embodiment. The method 500 comprises the step of encoding 502 the data x using a C(n, k, d) code, wherein the code C(n, k, d) has a length n and a minimum distance d, wherein $n = 2^{m_1} + \ldots + 2^{m_s}$, wherein $m_h$, $h = 1, \ldots, s$, is an integer number, on the basis of the equation:

$$c = uA,$$

wherein $u_i = x_{j_i}$, $0 \leq j_i < k-1$, if $i \notin F$, wherein F is a set of n−k frozen bit indices of the code C(n, k, d), and $u_i = \Sigma_{s=0}^{i-1} \mathbb{V}_{\phi_i,s} u_s$, if $i \in F$, wherein V is a constraint matrix given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

FIG. 6 shows a schematic diagram of a method 600 for decoding a codeword c of length n according to an embodiment. The method 600 comprises the step of decoding 602 the codeword c using a C(n, k, d) code, wherein the code C(n, k, d) has a length n and a minimum distance d, wherein $n = 2^{m_1} + \ldots + 2^{m_s}$, wherein $m_h$, $h = 1, \ldots, s$, is an integer number, wherein:

$$c = uA,$$

wherein $u_i = x_{j_i}$, $0 \leq j_i < k-1$, wherein x is data of dimension k, if $i \notin F$, wherein F is a set of n k frozen bit indices of the code C(n, k, d) and $u_i = \Sigma_{s=0}^{i-1} \mathbb{V}_{\phi_i,s} u_s$, if $i \in F$, wherein $\mathbb{V}$ is a constraint matrix given by a solution of the equation:

$$\mathbb{W} \mathbb{V}^T = 0,$$

wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the aft in light of the above teachings. Of course, those skilled in the art will readily recognize that there are numerous applications of the application beyond those described herein. While the present application has been described with reference to one or more particular embodiments, those skilled in the art will recognize that many changes may be made thereto without departing from the scope of the present application. It is therefore to be understood that within the scope of the appended claims and their equivalents, the application may be practiced otherwise than as specifically described herein.

What is claimed is:

1. An encoding apparatus, comprising:
   a processor; and
   a non-transitory computer-readable storage medium storing a program for encoding data x of dimension k into a codeword c of length n, the program to be executed by the processor, the program including instructions to:
   encode the data x using a C(n, k, d) code, wherein the code C(n, k, d) has a length n and a minimum distance d, wherein $n=2^{m_1}+ \ldots +2^{m_s}$, wherein $m_h$, $h=1, \ldots, s$, is an integer number, on the basis of the equation:

$c=uA,$ wherein $u_i=x_{j_i}$, $0 \le j_i < k-1$, if $i \notin F$, wherein F is a set of n−k frozen bit indices of the code C(n, k, d), and $u_i=\Sigma_{s=0}^{i-1} \mathbb{V}_{\phi_i,s} u_s$, if $i \in F$, wherein $\mathbb{V}$ is a constraint matrix given by a solution of the equation:

$\mathbb{W}\mathbb{V}^T=0,$ wherein $\phi_i$ is an index of a row of the matrix $\mathbb{V}$, which has a last non-zero element in column i, wherein $\mathbb{W}$ is a precoding matrix, and wherein A is defined as:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

and
   wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself; and
   send, after the codeword c is encoded, encoded codeword c over a transmission channel to a decoding apparatus for recovery of correct symbols of codeword c.

2. The encoding apparatus of claim 1, wherein the program further includes instructions to:
   construct the code C(n, k, d) according to a plurality of nested linear block codes $C_{ij}(2^{m_i}, K_{i,j}, d_{ij})$, $K_{i,j+1} > K_{i,j}$, $0 \le j < \tau_i$, wherein $\tau_i$ is a positive integer, wherein a generator matrix of $C_{ij}(2^{m_i}, K_{i,j}, d_{ij})$ is given by the equation:

$$\tilde{G}^{(i,j)} = \begin{pmatrix} G^{(i,0)} \\ G^{(i,1)} \\ \vdots \\ G^{(i,j)} \end{pmatrix},$$

wherein $G^{(i,j)}$ is a $k_{i,j} 2^{m_i}$ matrix, $K_{i,j}=\Sigma s=0^j k_{i,s}$, wherein a precoding matrix of $G^{(i,j)}$ is defined by $$W^{(i,j)} = G^{(i,j)} \begin{pmatrix} 1 & 0 \\ 1 & 1 \end{pmatrix}^{\otimes i},$$

wherein a precoding matrix of $\tilde{G}^{(i,j)}$ is defined by $\tilde{W}^{(i,j)}=$ $$\tilde{W}^{(i,j)} = \tilde{G}^{(i,j)} \begin{pmatrix} 1 & 0 \\ 1 & 1 \end{pmatrix}^{\otimes i},$$

and wherein an index $l_{i,p}$ of a column, where a p-th row of the matrix $\tilde{W}^{(i,\tau_i-1)}$ starts, is defined by the equation $$l_{i,p} = \min_{\tilde{W}^{(i,\tau_i-1)}_{p,t}=1} 0 \le t < 2^i \, t,$$

and
   construct the precoding matrix $\mathbb{W}$ as a block matrix, wherein the blocks of the precoding matrix $\mathbb{W}$ consist of selected rows of the matrices $\tilde{W}^{(i,j)}$.

3. The encoding apparatus of claim 2, wherein the plurality of nested linear block codes $C_{ij}(2^{m_i}, K_{i,j}, d_{ij})$ are extended Bose-Chaudhuri-Hocquenghem (e-BCH) codes.

4. The encoding apparatus of claim 2, wherein the program further includes instructions to construct a precoding matrix $\widetilde{\mathbb{W}}$ of the code $C(n, k, d)$ according to:

$$\tilde{W} = \begin{pmatrix} \tilde{W}^{(1,r_1)} & 0 & 0 & \cdots & 0 \\ 0 & \tilde{W}^{(2,r_2)} & 0 & \cdots & 0 \\ 0 & 0 & \tilde{W}^{(3,r_3)} & \cdots & 0 \\ \vdots & \vdots & \vdots & \ddots & \vdots \\ 0 & 0 & 0 & \cdots & \tilde{W}^{(s,r_s)} \\ W^{(1,r_1+1)} & \hat{W}^{(2,1)} & \hat{W}^{(3,1)} & \cdots & \hat{W}^{(s,1)} \\ 0 & W^{(2,r_2+1)} & \hat{W}^{(3,2)} & \cdots & \hat{W}^{(s,2)} \\ \vdots & \vdots & \vdots & \ddots & \vdots \end{pmatrix},$$

wherein $r_i = \max_{j: d_{ij} \geq d} j$ is an index of a largest e-BCH code of length $2^{m_i}$ having a minimum distance of at least d, and wherein $\hat{W}^{(i,j)}$ is a matrix defined on the basis of the matrix $\tilde{W}$.

5. The encoding apparatus of claim 2, wherein the program further includes instructions to construct the matrix $\hat{W}^{(i,j)}$ using rows of the matrix $\tilde{W}^{(i,\tau_j)}$ having the smallest value of $P_{m_i, l_{i,p}}$, wherein $P_{m,l}$ is an error probability in a bit subchannel $\tilde{W}_m^{(i)}(y_0^{2^m-1}, u_0^{i-1} | u_i)$, and wherein $y_0^{2^m-1} = y_0 \ldots y_{2^m-1}$ denotes $2^m - 1$ noisy symbols of the codeword c after a transmission over a communication channel.

6. The encoding apparatus of claim 2, wherein the program further includes instructions to arrange the rows of the matrix $W^{(i,r_i+1)}$ or $\hat{W}^{(j,i)}$ in an ascending order of the values $l_{i,p}$ and $l_{j,p}$, respectively.

7. The encoding apparatus of claim 2, wherein the program further includes instructions to construct the matrix $\mathbb{W}$ based on k rows of the matrix $\widetilde{\mathbb{W}}$ with the smallest values of $l_{i,p}$.

8. The encoding apparatus of claim 1, wherein the program further includes instructions to:
construct a first plurality of t rows of the matrix $\mathbb{V}$ such that the last non-zero elements in the first plurality of t rows are located in distinct positions j, $j \geq j_0$ for some integer $j_0$;
construct elements of the first plurality of t rows located in columns having an index $z < j$ using a pseudorandom number generator; and
construct a second plurality of n−k−t rows of matrix V as distinct weight-one rows.

9. The encoding apparatus of claim 8, wherein the pseudorandom number generator is a linear feedback shift register.

10. A method, comprising:
encoding data x of dimension k into a codeword c of length n using a $C(n, k, d)$ code, wherein the code $C(n, k, d)$ has a length n and a minimum distance d, wherein $n = 2^{m_1} + \ldots + 2^{m_s}$, wherein $m_h$, $h=1, \ldots, s$, is an integer number, on the basis of the equation:

$c = uA$, wherein $u_i = x_{j_i}$, $0 \leq j_i < k-1$, if $i \notin F$, wherein F is a set of n−k frozen bit indices of the code $C(n, k, d)$, and $u_i = \Sigma_{s=0}^{i-1} \mathbb{V}_{\phi_i, s} u_s$, if $i \in F$ wherein $\mathbb{V}$ is a constraint matrix given by a solution of the equation:

$\mathbb{W} \mathbb{V}^T = 0$, wherein $\phi_i$ is an index of a row of the matrix V, which has a last non-zero element in column i, wherein $\mathbb{W}$ is a precoding matrix, and wherein A is defined as:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

and
wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself; and
sending, after the codeword c is encoded, encoded codeword c over a transmission channel to a decoding apparatus for recovery of correct symbols of codeword c.

11. The method of claim 10, further comprising:
constructing the code $C(n, k, d)$ on the basis of a plurality of nested linear block codes $C_{ij}(2^{m_i}, K_{i,j}, d_{ij})$, $K_{i,j+1} > K_{i,j}$, $0 \leq j < \tau_i$, wherein $\tau_i$ is a positive integer, wherein a generator matrix of $C_{ij}(2^{m_i}, K_{i,j}, d_{ij})$ is given by the equation:

$$\tilde{G}^{(i,j)} = \begin{pmatrix} G^{(i,0)} \\ G^{(i,1)} \\ \vdots \\ G^{(i,j)} \end{pmatrix},$$

wherein $G^{(i,j)}$ is a $k_{i,j} \times 2^{m_i}$ matrix, $K_{i,j} = \Sigma_{s=0}^{j} k_{i,s}$, wherein a precoding matrix of $G^{(i,j)}$ is defined by $$\tilde{W}^{(i,j)} = \tilde{G}^{(i,j)} \begin{pmatrix} 1 & 0 \\ 1 & 1 \end{pmatrix}^{\otimes i},$$

wherein a precoding matrix of $\tilde{G}^{(i,j)}$ is defined by $$W^{(i,j)} = G^{(i,j)} \begin{pmatrix} 1 & 0 \\ 1 & 1 \end{pmatrix}^{\otimes i},$$

wherein an index $l_{i,p}$ of a column, where a p-th row of the matrix $\tilde{W}^{(i,\tau_i-1)}$ starts, is defined by the equation $$l_{i,p} = \min_{\tilde{W}^{(i,\tau_i-1)}_{p,t} = 1} 0 \leq t < 2^i \quad t, \, 0 \leq p < 2^{m_i};$$

and
construct the precoding matrix $\mathbb{W}$ as a block matrix, wherein the blocks of the precoding matrix $\mathbb{W}$ consist of selected rows of the matrices $\tilde{W}^{(i,j)}$.

12. The method of claim 11, wherein the plurality of nested linear block codes $C_{ij}(2^{m_i}, K_{i,j}, d_{ij})$ are extended Bose-Chaudhuri-Hocquenghem (e-BCH) codes.

13. The method of claim 11, further comprising:

constructing a precoding matrix $\tilde{W}$ of the code $C(n, k, d)$ according to:

$$\tilde{W} = \begin{pmatrix} \tilde{W}^{(1,r_1)} & 0 & 0 & \cdots & 0 \\ 0 & \tilde{W}^{(2,r_2)} & 0 & \cdots & 0 \\ 0 & 0 & \tilde{W}^{(3,r_3)} & \cdots & 0 \\ \vdots & \vdots & \vdots & \ddots & \vdots \\ 0 & 0 & 0 & \cdots & \tilde{W}^{(s,r_s)} \\ W^{(1,r_1+1)} & \hat{W}^{(2,1)} & \hat{W}^{(3,1)} & \cdots & \hat{W}^{(s,1)} \\ 0 & W^{(2,r_2+1)} & \hat{W}^{(3,2)} & \cdots & \hat{W}^{(s,2)} \\ \vdots & \vdots & \vdots & \ddots & \vdots \end{pmatrix},$$

wherein $r_i = \max_{j: d_{ij} \geq d} j$ is an index of a largest e-BCH code of length $2^{m_i}$ having a minimum distance of at least d, and wherein $\hat{W}^{(i,j)}$ is a matrix defined on the basis of the matrix $\tilde{W}$.

14. The method of claim 11, further comprising:

constructing the matrix $\hat{W}^{(i,j)}$ using rows of the matrix $\tilde{W}^{(i,\tau_j)}$ having the smallest value of $P_{m_i, l_{i,p}}$, wherein P an error probability in a bit subchannel $W_m^{(i)}(y_0^{2^m-1}, u_0^{i-1}|u_i)$, and wherein $y_0^{2^m-1} = y_0 \cdots y_{2^m-1}$ denotes $2^m-1$ noisy symbols of the codeword c after a transmission over a communication channel.

15. The method of claim 10, further comprising:

constructing a first plurality of t rows of the matrix $\mathbb{V}$ such that the last non-zero elements in the first plurality of t rows are located in distinct positions j, $j \geq j_0$ for some integer $j^0$;

constructing elements of the first plurality of t rows located in columns having an index $z < j$ using a pseudorandom number generator; and constructing a second plurality of n−k−t rows of matrix V as distinct weight-one rows.

16. A decoding apparatus a processor; and a non-transitory computer-readable storage medium storing a program for decoding a codeword c of length n, the program to be executed by the processor, the program including instructions to:

receive, from an encoding apparatus, a signal that is transmitted over a transmission channel and that has the codeword c in an encoded form; and decode the codeword c using a C(n, k, d) code, wherein the code C(n, k, d) has a length n and a minimum distance d, wherein $n = 2^{m_1} + \cdots + 2^{m_s}$, wherein $m_h$, h=1, ... s, is an integer number, wherein:

$c = uA$, wherein $u_i = x_{j_i}$, $0 \leq j_i < -1$, wherein x is data of dimension k, if $i \notin F$, wherein F is a set of n−k frozen bit indices of the code C(n, k, d) and $u_i = \Sigma_{s=0}^{i-1} \mathbb{V}_{\phi_i, s} u_s$, if $\in F$, wherein $\mathbb{V}$ is a constraint matrix given by a solution of the equation:

$\mathbb{W} \mathbb{V}^T = 0$, wherein $\phi_i$ is an index of a row of the matrix $\mathbb{V}$, which has a last non-zero element in column i, wherein $\mathbb{W}$ is a precoding matrix, and wherein A is defined as:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

17. The decoding apparatus of claim 16, wherein the instructions to decode the codeword include instructions to decode the codeword c by generalization of a successive cancellation algorithm.

18. The decoding apparatus of claim 17, wherein the program further includes instructions to compute u according to:

$$\hat{u}_i = \Sigma_{s=0}^{i-1} \mathbb{V}_{\phi_i, s} \hat{u}_s, \text{ if } i \in F$$

and $$\hat{u}_i = \arg\max_{u_i} W_{\mu_i}^{(i \bmod 2^{\mu_i})}(y_{t_i}^{2^{\mu_i}+t_i-1}, \hat{u}_{t_i}^{i-1}|u_i), \text{ if } i \notin F$$

wherein $\phi_i$ is an index of a row of the matrix $\mathbb{V}$, which has a last non-zero element in column i, wherein $y_0^{n-1} = y_0 \cdots y_{n-1}$ denotes n noisy symbols of the codeword c after a transmission over a communication channel to the decoding apparatus, $\mu_i = \lfloor \log_2(2^{\lceil \log_2 n \rceil} - i) \rfloor$, and $t_i = 2^{\lceil \log_2 n \rceil} - 2^{\mu_i + 1}$.

19. The decoding apparatus of claim 18, wherein the program further includes instructions to compute $\hat{u}_{i_1}$ before $\hat{u}_{i_2}$, if $\mu_{i_1} = \mu_{i_2}$ and $i_1 < i_2$, and to compute $\hat{u}_s$: $\mathbb{V}_{\phi_i, s} \neq 0$, s<i, before $\hat{u}_i$, if $i \in F$.

20. A method, comprising:

receiving, from an encoding apparatus, a signal that is transmitted over a transmission channel and that has the codeword c of length n in encoded form; and decoding the codeword c using a C(n, k, d) code, wherein the code C(n, k, d) has a length n and a minimum distance d, wherein $n = 2^{m_1} + \cdots + 2^{m_s}$, wherein $m_h$, h=1, ... ,s, is an integer number, wherein:

$c = uA$, wherein $u_i = x_{j_i}$, $0 \leq j_i < k-1$, wherein x is data of dimension k, if $i \notin F$, wherein F is a set of n−k frozen bit indices of the code C(n, k, d), and $u_i = \Sigma_{s=0}^{i-1} \mathbb{V}_{\phi_i, s} u_s$, if $i \in F$, wherein $\mathbb{V}$ is a constraint matrix given by a solution of the equation:

$\mathbb{W} \mathbb{V}^T = 0$, wherein $\phi_i$ is an index of a row of the matrix $\mathbb{V}$, which has a last non-zero element in column i, wherein $\mathbb{W}$ is a precoding matrix, and wherein A is defined as follows:

$$A = \begin{pmatrix} A_{m_1} & 0 & \cdots & 0 \\ 0 & A_{m_2} & \cdots & 0 \\ \vdots & \vdots & \ddots & \vdots \\ 0 & 0 & \cdots & A_{m_s} \end{pmatrix},$$

wherein $$A_{m_h} = \begin{pmatrix} 1 & 0 \\ 1 & 1 \end{pmatrix}^{\otimes m_h},$$

and wherein $Q^{\otimes m}$ denotes the m-times Kronecker product of a matrix Q with itself.

* * * * *

UNITED STATES PATENT AND TRADEMARK OFFICE
CERTIFICATE OF CORRECTION

PATENT NO. : 10,848,185 B2
APPLICATION NO. : 16/272173
DATED : November 24, 2020
INVENTOR(S) : Kurmaev et al.

It is certified that error appears in the above-identified patent and that said Letters Patent is hereby corrected as shown below:

In the Claims

In Column 16, Line 41, Claim 2, delete "$k_{i,j}2^{m_i}$" and insert --$k_{i,j} \times 2^{m_i}$--.

In Column 16, Line 53, Claim 2, delete "$\tilde{W}^{(i,j)} =$".

In Column 16, Line 56, Claim 2, delete "$l_{iip}$" and insert --$l_{i,p}$--.

In Column 16, Line 60, Claim 2, delete "$l_{i,p} = \min_{\substack{0 \leq t < 2^i \\ \tilde{w}_{p,t}^{(i,\tau_i-1)}=1}} t,$" and insert --$l_{i,p} = \min_{\substack{0 \leq t < 2^i \\ \tilde{w}_{p,t}^{(i,\tau_i-1)}=1}} t, 0 \leq p < 2^{m_i};$--.

In Column 18, Line 46, Claim 11, delete "$\tilde{W}^{(i,j)} = \tilde{G}^{(i,j)}$" and insert --$W^{(i,j)} = G^{(i,j)}$--.

In Column 18, Line 53, Claim 11, delete "$W^{(i,j)} = G^{(i,j)}$" and insert --$\tilde{W}^{(i,j)} = \tilde{G}^{(i,j)}$--.

In Column 19, Line 29, Claim 14, delete "wherein P" and insert --wherein $P_{m,i}$ is--.

In Column 19, Line 38, Claim 15, delete "j°" and insert --$j_o$--.

In Column 19, Line 39, Claim 15, delete "oft rows" and insert --of $t$ rows--.

In Column 19, Line 61, Claim 16, delete "$u_i = x_{j_i}, 0 \leq j_i < -1$" and insert --$u_i = x_{j_i}, 0 \leq j_i < k-1$--.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*

In Column 19, Line 63, Claim 16, delete "if ∉ F" and insert --if $i \notin F$--.

In Column 21, Line 3, Claim 20, delete "follows".